US 8,262,923 B2

(12) United States Patent
Fang et al.

(10) Patent No.: US 8,262,923 B2
(45) Date of Patent: Sep. 11, 2012

(54) HIGH PRESSURE BEVEL ETCH PROCESS

(75) Inventors: Tong Fang, Palo Alto, CA (US); Yunsang S. Kim, Monte Sereno, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 287 days.

(21) Appl. No.: 12/635,846

(22) Filed: Dec. 11, 2009

(65) Prior Publication Data
US 2010/0151686 A1 Jun. 17, 2010

Related U.S. Application Data

(60) Provisional application No. 61/138,357, filed on Dec. 17, 2008.

(51) Int. Cl.
*B44C 1/22* (2006.01)
(52) U.S. Cl. ..................... 216/67; 156/345.51
(58) Field of Classification Search .......... None
See application file for complete search history.

(56) References Cited

U.S. PATENT DOCUMENTS

| | | | | |
|---|---|---|---|---|
| 5,438,009 | A * | 8/1995 | Yang et al. | 438/253 |
| 6,436,303 | B1 | 8/2002 | Kim et al. | |
| 6,837,967 | B1 | 1/2005 | Berman et al. | |
| 7,002,175 | B1 * | 2/2006 | Singh et al. | 257/25 |
| 2004/0251518 | A1 * | 12/2004 | Preusse et al. | 257/571 |
| 2006/0016459 | A1 * | 1/2006 | McFarlane et al. | 134/1.1 |
| 2006/0051967 | A1 | 3/2006 | Chang et al. | |
| 2006/0054279 | A1 | 3/2006 | Kim et al. | |
| 2007/0068899 | A1 | 3/2007 | Yoon | |
| 2007/0068900 | A1 | 3/2007 | Kim et al. | |
| 2007/0228008 | A1 | 10/2007 | Wolfe et al. | |
| 2008/0083703 | A1 | 4/2008 | Suzuki et al. | |
| 2008/0179010 | A1 | 7/2008 | Bailey, III et al. | |
| 2008/0179297 | A1 | 7/2008 | Bailey et al. | |
| 2008/0216864 | A1 | 9/2008 | Sexton et al. | |

OTHER PUBLICATIONS

Jeon et al, Cleaning of wafer edge, bevel and back-side with a torus-shaped capacitively coupled plasma, Nov. 6, Plasma Sources Science and Technology, p. 520-524.*
Zhang et al, A 3-GHz 70-Mb SRAM in 65-nm CMOS Technology with Integrated Column-Based Dynamic Power Supply, Jan. 2006, IEEE Journal of solid-state circuits, vol. 41,No. 1, p. 146-151.*
International Search Report and Written Opinion mailed Jul. 13, 2010 for PCT/US2009/006531.
Corresponding U.S. Appl. No. 61/138,357, filed Dec. 17, 2008.
Commonly Assigned U.S. Patent Publication No. 2008/0050923A1, published Feb. 28, 2008.
Commonly Assigned U.S. Patent Publication No. 2008/0156772A1, published Jul. 3, 2008.
Commonly Assigned U.S. Patent Publication No. 2008/0182412A1, published Jul. 31, 2008.

(Continued)

*Primary Examiner* — Binh X Tran
*Assistant Examiner* — David Cathey, Jr.
(74) *Attorney, Agent, or Firm* — Buchanan Ingersoll & Rooney PC

(57) ABSTRACT

A method of preventing arcing during bevel edge etching a semiconductor substrate with a plasma in a bevel etcher in which the semiconductor substrate is supported on a semiconductor substrate support comprises bevel edge etching the semiconductor substrate with the plasma in the bevel etcher while evacuating the bevel etcher to a pressure of 3 to 100 Torr while maintaining RF voltage seen at the wafer at a low enough value to avoid arcing.

14 Claims, 2 Drawing Sheets

OTHER PUBLICATIONS

Commonly Assigned U.S. Patent Publication No. 2008/0190448A1, published Aug. 14, 2008.

Commonly Assigned U.S. Patent Publication No. 2008/0227301A1, published Sep. 18, 2008.

* cited by examiner

HIGH PRESSURE BEVEL ETCH PROCESS

CROSS-REFERENCE TO RELATED APPLICATIONS

This application claims priority under 35 U.S.C. §119 to U.S. Provisional Application No. 61/138,357 entitled HIGH PRESSURE BEVEL ETCH PROCESS, filed Dec. 17, 2008, the entire content of which is hereby incorporated by reference.

SUMMARY

Disclosed herein is a method of bevel edge etching a semiconductor under arcing-free conditions in a bevel etcher in which the semiconductor substrate is supported on a semiconductor substrate support. Arcing-free is intended to mean that no more than 1 out of 10,000 wafers exhibit arcing damage after the bevel etch process. The method comprises evacuating the bevel etcher to a pressure of 3 to 100 Torr and maintaining RF voltage seen by the wafer below a threshold value at which arcing would occur; flowing process gas into the bevel etcher; energizing the process gas into a plasma at a periphery of the semiconductor substrate; and bevel etching the semiconductor substrate with the plasma.

DETAILED DESCRIPTION

Bevel clean modules (bevel etchers), for example, the 2300 CORONUS™ product manufactured by Lam Research Corporation, Fremont, Calif., remove films on the edge of a wafer using edge confined plasma technology. For 65 nm technologies and below, a primary source of device yield limiters are coming from defects transferred from the wafer edge. During device patterning, complex interactions of film deposition, lithography, etching and chemical mechanical polishing result in a wide range of unstable film stacks on the wafer edge. In subsequent steps, these film layers can produce defects that are transported to the device area of the wafer. Removal of these films at select points in the integration flow results in reduced defects and higher device yields. Accordingly, edge confined plasma provides control of the wafer edge buildup at multiple steps during the device fabrication process.

Bevel etched wafers can exhibit macro-arcing, micro-arcing, surface charge and discharge problems on sensitive Back-End-Of-Line (BEOL) wafers. RF voltage at the wafer has been found to correlate with arcing probabilities. As disclosed herein, RF voltage (measured by a VCI probe) seen at the wafer can be reduced for a given electrode power setting by increasing the pressure in the plasma chamber. Thus, at higher pressure regimes, it is possible to widen the process window in terms of power setting and gas chemistry while avoiding the arcing problem. The RF voltage is preferably maintained below a threshold value which depends on the device structure or wafer sensitivity to arcing.

Plasma processing in a bevel etcher 200, for example, to remove bevel edge build-up from a semiconductor substrate can comprise etching the bevel edge with a fluorine-containing plasma. The semiconductor substrate may comprise, for example, a wafer made with a copper Back-End-Of-the-Line (BEOL) damascene process. The semiconductor substrate may have a diameter of about 300 mm. The semiconductor substrate may comprise a bevel edge portion (e.g., up to about two mm wide) that surrounds multilayer integrated circuit (IC) device structures containing exposed copper inwardly of the bevel edge. The exposed copper surfaces may comprise copper surfaces on tantalum-containing seed layers across the wafer.

Figure 1:
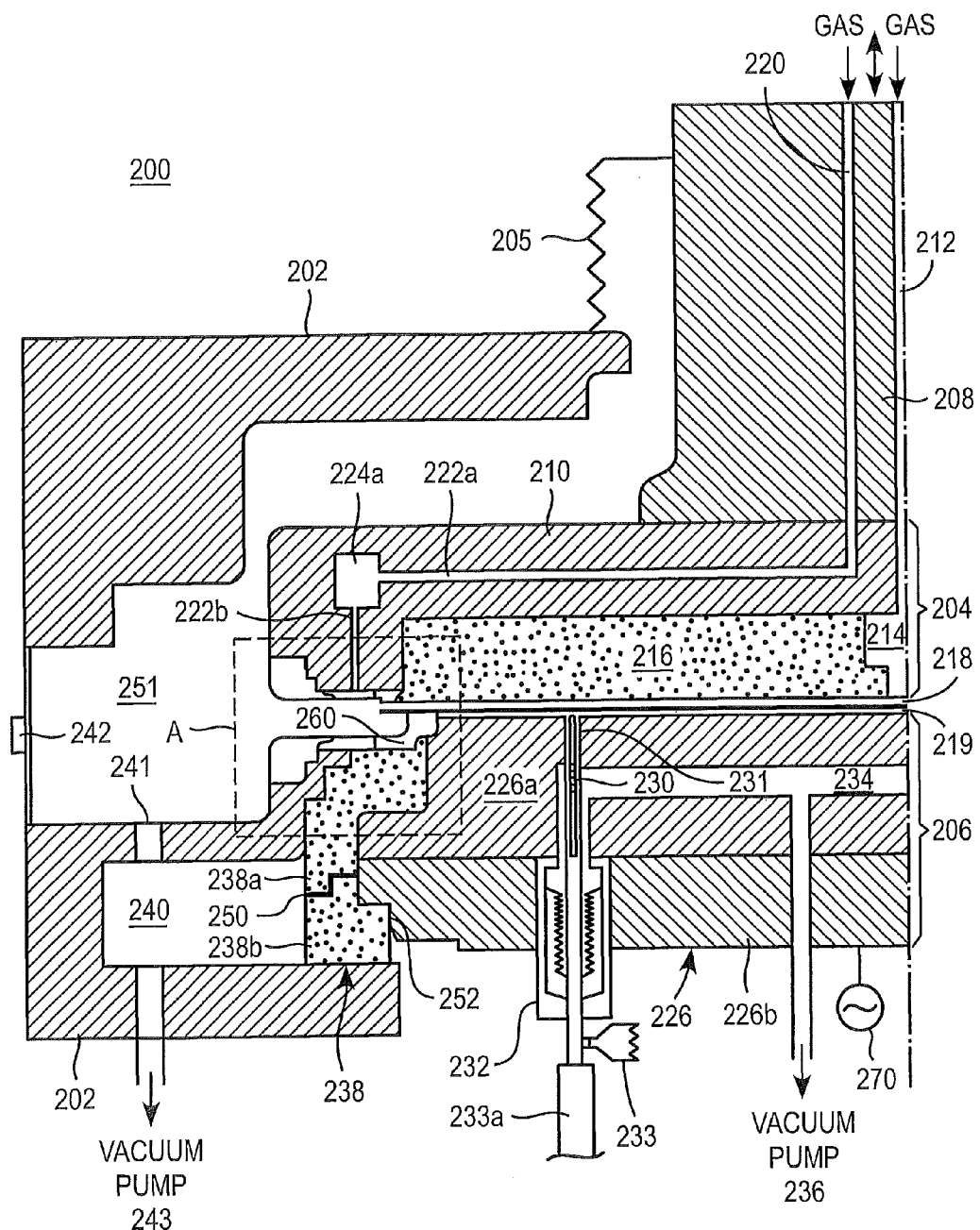
FIG. 1 is a schematic cross sectional diagram of a bevel etcher in accordance with an embodiment.

Referring now to FIG. 1, there is shown a schematic cross sectional diagram of a substrate etching system or bevel etcher 200 for cleaning the bevel edge of a substrate 218 in accordance with one embodiment, as disclosed in commonly assigned U.S. Patent Application Pub. No. 2008/0182412, the disclosure of which is hereby incorporated by reference.

The bevel etcher 200 has a generally, but not limited to, axisymmetric shape and, for brevity, only half of the side cross sectional view is shown in FIG. 1. As depicted, the bevel etcher 200 includes: a chamber wall 202 having a door or gate 242 through which the substrate 218 is loaded/unloaded; an upper electrode assembly 204; a support 208 from which the upper electrode assembly 204 is suspended; and a lower electrode assembly 206. A precision driving mechanism (not shown in FIG. 1) is attached to the support 208 for moving upper electrode assembly 204 up and down (in the direction of the double arrow) so that the gap between the upper electrode assembly 204 and the substrate 218 is controlled accurately.

Metal bellows 205 are used to form a vacuum seal between the chamber wall 202 and support 208 while allowing the support 208 to have a vertical motion relative to the chamber wall 202. The support 208 has a center gas feed (passage) 212 and an edge gas feed (passage) 220. One or both gas feeds 212, 220 can deliver process gas to be energized into plasma to clean the bevel edge. During operation, the plasma is formed around the bevel edge of the substrate 218 and has a generally ring shape. To prevent the plasma from reaching the central portion of the substrate 218, the space between an upper dielectric plate 216 on the upper electrode assembly 204 and the substrate 218 is small and the process gas is fed from the center feed, in an embodiment through a stepped hole 214. Then, the gas passes through the gap between the upper electrode assembly 204 and the substrate 218 in the radial direction of the substrate. Each gas feed is used to provide the same process gas or other gases, such as purge gas. For instance, the purge gas can be injected through the center gas feed 212, while the process gas can be injected through the edge gas feed 220. The plasma/process gas is withdrawn from the chamber space 251 to the bottom space 240 via a plurality of holes (outlets) 241, e.g., a vacuum pump 243 can be used to evacuate the bottom space 240 during a cleaning operation. During a bevel cleaning operation, the chamber pressure is maintained at a pressure of 3 to 100 Torr (e.g., 3 to 5 Torr, 5 to 10 Torr, 10 to 50 Torr or 50 to 100 Torr). Such pressure is higher than the exemplary pressures disclosed in commonly assigned U.S. Patent Publication Nos. 2008/0227301, 2008/0050923, 2008/0156772 and 2008/0190448, the disclosures of which are hereby incorporated by reference.

The process gas can comprise an oxygen-containing gas, such as $O_2$; $N_2O$, CO, COS and/or $CO_2$. Fluorine-containing gas, such as, for example, $SF_6$, $NF_3$, $C_xF_y$, (e.g., $CF_4$, $C_2F_4$, $C_2F_6$), $C_xF_yH_2$ (e.g., $C_3HF$, $CHF_3$, $CH_2F_2$, $C_2H_2F_4$), can also be added to the process gas. The process gas can comprise $H_2$, He, Ar, Xe, Kr, $N_2$ or mixtures thereof. The process gas can be free of fluorine and oxygen. The amount of fluorine-containing gas in the process gas can depend on the specific film(s)

being removed by bevel (edge) etching. For example, small amounts, such as <10% by volume, or large amounts, such as >80% or >90% by volume, of fluorine-containing gas can be present in the process gas. In different embodiments, the process gas can comprise, for example, about 5% by volume $NF_3$/balance $CO_2$ or about 10% by volume $CF_4$/balance $CO_2$.

The upper electrode assembly 204 includes: an upper dielectric plate 216; and an upper metal component 210 secured to the support 208 by a suitable fastening mechanism and grounded via the support 208. The upper metal component 210 is formed of a metal, such as aluminum, and may be anodized. The upper metal component 210 has one or more edge gas passageways or through holes 222a, 222b and an edge gas plenum 224 224a, wherein the edge gas passageways or through holes 222a, 222b are coupled to the edge gas feed 220 for fluid communication during operation. The upper dielectric plate 216 is attached to the upper metal component 210 and formed of a dielectric material, for example, ceramic. If desired, the upper dielectric plate 216 may have a coating of $Y_2O_3$. Bulk $Y_2O_3$ or $Y_2O_3$ coated parts and ceramics such as SiC, SiN, Si, AlN and the like are preferred over alumina or anodized aluminum parts due to their ability to dissipate charges on the wafer and thus reduce the probability of arcing as indicated by lower RF voltage measurements. Typically, it is difficult to drill a deep straight hole in some ceramics, such as $Al_2O_3$, and therefore a stepped hole 214 can be used instead of a deep straight hole. While the upper dielectric plate 216 is shown with a single center hole, the upper dielectric plate 216 may have any suitable number of outlets, e.g., the outlets can be arranged in a showerhead hole pattern if desired.

The lower electrode assembly 206 includes: powered electrode 226 having an upper portion 226a and a lower portion 226b and optionally operative to function as a vacuum chuck to hold the substrate 218 in place during operation; lift pins 230 for moving the substrate 218 up and down; a pin operating unit 232; bottom dielectric ring 238 having an upper portion 238a and a lower portion 238b. In an embodiment, the chuck can be an electrostatic chuck. Hereinafter, the term powered electrode refers to one or both of the upper and lower portions 226a, 226b. Likewise, the term bottom dielectric ring 238 refers to one or both of the upper and lower portions 238a, 238b. The powered electrode 226 is coupled to a radio frequency (RF) power source 270 to receive RF power during operation.

The lift pins 230 move vertically within cylindrical holes or paths 231 and are moved between upper and lower positions by the pin operating unit 232 positioned in the powered electrode 226. The pin operating unit 232 includes a housing around each lift pin to maintain a vacuum sealed environment around the pins. The pin operating unit 232 includes any suitable lift pin mechanism, such as a robot arm 233 (e.g., a horizontal arm having segments extending into each housing and attached to each pin) and an arm actuating device (not shown in FIG. 1). For brevity, only a tip portion of a segment of the robot arm is shown in FIG. 1. While three or four lift pins can be used to lift a wafer, such as, for example, a 300 mm wafer, any suitable number of lift pins 230 may be used in the bevel etcher 200. Also, any suitable mechanisms, such as lifter bellows, can be used as the pin operating unit 232.

The substrate 218 is mounted on the lower electrode or on a lower configurable plasma-exclusion-zone (PEZ) ring 260, wherein the term PEZ refers to a radial distance from the center of the substrate to the outer edge of the area where the plasma for cleaning the bevel edge is to be excluded. The ring 260 is preferably a dielectric material. Bulk $Y_2O_3$ or $Y_2O_3$ coated parts and ceramics such as SiC, SiN, Si, AlN and the like are preferred over alumina or anodized aluminum parts due to their ability to dissipate charges on the wafer and thus reduce the probability of arcing as indicated by lower RF voltage measurements. In an embodiment, the top surface of the powered electrode 226, the bottom surface of the substrate 218, and inner periphery of the lower configurable PEZ ring 260 can form an enclosed vacuum region recess (vacuum region) 219 in fluid communication with a vacuum source such as a vacuum pump 236. The cylindrical holes or paths for the lift pins 230 are also shared as gas passageways, through which the vacuum pump 236 evacuates the vacuum region 219 during operation. The powered electrode 226a, 226b includes a plenum 234 to reduce temporal pressure fluctuations in the vacuum region 219 and, in cases where multiple lift pins are used, to provide a uniform suction rate for the cylindrical holes.

On the top surface of the substrate 218 are integrated circuits, which can contain exposed copper surfaces which may be on tantalum-containing seed layers, formed by a series of processes. One or more of the processes may be performed by use of plasma that may transfer heat energy to the substrate, developing thermal stress on the substrate and thereby causing wafer bowing. During a bevel cleaning operation, the substrate bowing can be reduced by use of a pressure difference between the top and bottom surfaces of the substrate 218. The pressure in the vacuum region 219 is maintained under vacuum during operation by a vacuum pump 236 coupled to the plenum 234. By adjusting the gap between the upper dielectric plate 216 and the top surface of the substrate 218, the gas pressure in the gap can be varied without changing the overall flow rate of the process gas(es). Thus, by controlling the gas pressure in the gap, the pressure difference between the top and bottom surfaces of the substrate 218 can be varied and thereby the bending force applied on the substrate 218 can be controlled.

The bottom dielectric ring 238a, 238b is formed of a dielectric material, such as ceramic including $Al_2O_3$, $Y_2O_3$ or the like and electrically separates the powered electrode 226 from the chamber wall 202. Bulk $Y_2O_3$ or $Y_2O_3$ coated parts and ceramics such as SiC, SiN, Si, AlN and the like are preferred over alumina or anodized aluminum parts due to their ability to dissipate charges on the wafer and thus reduce the probability of arcing as indicated by lower RF voltage measurements. The lower portion 238b of the bottom dielectric ring in an embodiment has a step 252 formed on the inner periphery of its upper surface to mate with a recess on a lower edge of the powered electrode 226. The lower portion 238b in an embodiment has a step 250 formed on its outer periphery to mate with a stepped surface on the upper portion 238a of the bottom dielectric ring, referred to as a focus ring. The steps 250, 252 align the bottom dielectric ring 238 with the powered electrode 226. The step 250 also forms a tortuous gap along the surface thereof to eliminate the direct line-of-sight between the powered electrode 226 and the chamber wall 202 thereby reducing the possibility of a secondary plasma strike between the powered electrode 226 and the chamber wall 202.

The bevel edge cleaning plasma processing can comprise feeding a gas mixture including, for example, $NF_3$ or $CF_4$ into the bevel etcher and energizing the gas mixture into a plasma state. In particular, the gas mixture may comprise $NF_3$ and $CO_2$ or $CF_4$ and $CO_2$. For example, the gas mixture may comprise about 5% by volume $NF_3$/balance $CO_2$ or about 10% by volume $CF_4$/balance $CO_2$; the bevel edge cleaning plasma processing can comprise feeding a gas mixture of 5 to 15 sccm $NF_3$, 100 to 300 sccm $CO_2$ and 300 to 700 sccm $N_2$ into the bevel etcher and energizing the gas mixture into a plasma state; the bevel edge cleaning plasma processing can comprise flowing 300 to 600 sccm of a He—$H_2$ gas mixture containing 4% $H_2$ and 100 to 300 sccm $N_2$ into the bevel etcher; the bevel edge cleaning plasma processing can also comprise flowing 5 to 20 sccm $NF_3$, $CF_4$ and 100 to 300 sccm $CO_2$ gas into the bevel etcher at a periphery of the semiconductor substrate. The gas mixture may be fed into the bevel etcher at a periphery and/or at the center of the semiconductor substrate. For example, when the fluorine-containing gas mixture is fed into the bevel etcher at a periphery of the semiconductor substrate, $N_2$, He, Ar, Xe, Kr or mixtures thereof gas may be fed into the bevel etcher at a center of the semiconductor substrate.

Bevel etching can result in arcing in the outer periphery of the wafer leading to loss of yield of devices being manufactured. Such yield losses can exceed 3% of the wafer yield. Thus, eliminating arcing in the outer region of the bevel edge cleaned wafer is desirable in order to improve yield of devices on the processed wafer.

In an embodiment, conditions for processing of the semiconductor substrate with the plasma include an exposure time of greater than about 5 seconds, for example, about 30 seconds, and an RF power of greater than about 50 watts, for example, 50 to 2000 watts. In an embodiment, higher RF power at 2 to 60 $MH_z$ generates plasma from process gas flowed into the chamber at 5 to 3000 sccm.

Figure 2:
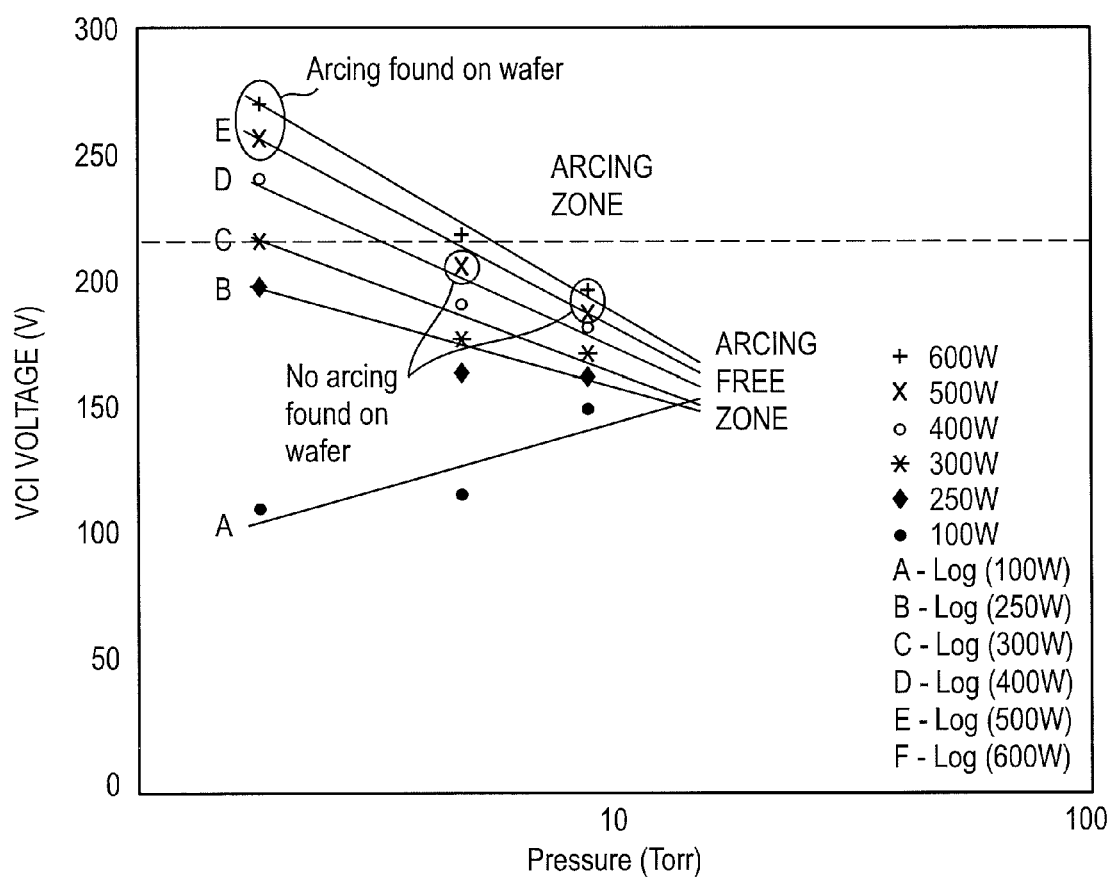
FIG. 2 is a graph showing arcing-free process conditions based on VCI voltage measurements.

FIG. 2 is a graph showing VCI voltage measured by a VCI probe connected to the RF feed to the bottom electrode supporting a test wafer bevel etched with process gas of 10 sccm $NF_3$, 200 sccm $CO_2$ and 500 sccm $N_2$. As can be seen in FIG. 2, at low pressures of $\leqq 2$ Torr arcing occurred at power levels of 500 watts and 600 watts. The arcing problem was not observed when the chamber pressure was increased to 5 Torr and 9 Torr for those same power settings. An arcing free process window appears to lie within a chamber pressure of at least 3 Torr while maintaining RF voltage seen at the wafer at a low enough value to avoid arcing. The threshold value will depend on the device structure and wafer sensitivity to arcing. In a preferred embodiment, the RF voltage measured by a VCI probe monitoring wafer voltage is no greater than about 220 volts. The elimination of arcing at the elevated chamber pressure was unexpected and implementation of a high pressure bevel edge cleaning process can be expected to provide substantial increases in yield of semiconductor devices undergoing further processing steps on the bevel cleaned wafer.

While various embodiments have been described, it is to be understood that variations and modifications may be resorted to as will be apparent to those skilled in the art. Such variations and modifications are to be considered within the purview and scope of the claims appended hereto.

What is claimed is:

1. A method of bevel edge etching a semiconductor substrate with a plasma in a bevel etcher in which the semiconductor substrate is supported on a semiconductor substrate support, comprising:
    supplying process gas to the bevel etcher and energizing the process gas into a plasma;
    bevel edge etching the semiconductor substrate with the plasma in the bevel etcher while evacuating the bevel etcher to a pressure of 3 to 100 Torr; and
    monitoring wafer voltage using a VCI probe and maintaining RF voltage measured by the VCI probe below a threshold of about 220 volts.

2. The method of claim 1, wherein the process gas is flowed into the bevel etcher at 5 to 3000 sccm, the plasma is generated by an electrode supplied RF power at 50 to 2000 watts and at a frequency of 2 to 60 $MH_z$ and the process gas comprises at least one of $CO_2$, CO, $O_2$, $N_2$, $H_2$, He, Ar, Xe, $NF_3$, $C_xF_y$, $C_xF_yH_z$, $SF_6$, COS and $N_2O$.

3. The method of claim 1, wherein the process gas includes nitrogen, argon, helium, xenon, krypton, and mixtures thereof.

4. The method of claim 1, wherein the process gas is free of fluorine and oxygen.

5. The method of claim 1, comprising flowing about 10-2000 sccm of process gas into the bevel etcher and maintaining the chamber at a pressure of 3 to 10 Torr.

6. The method of claim 1, comprising dissipating charges on the substrate by using $Y_2O_3$ parts in the bevel etcher.

7. The method of claim 1, wherein the substrate is a 300 mm BEOL wafer.

8. A method of bevel edge etching a semiconductor substrate with a plasma in a bevel etcher in which the semiconductor substrate is supported on a semiconductor substrate support, comprising: flowing a process gas comprising 5 to 15 sccm $NF_3$, 100 to 300 sccm $CO_2$ and 300 to 700 sccm $N_2$ into the bevel etcher and energizing the process gas into a plasma; and bevel edge etching the semiconductor substrate with the plasma in the bevel etcher while evacuating the bevel etcher to a pressure of 3 to 100 Torr.

9. A method of bevel edge etching a semiconductor substrate with a plasma in a bevel etcher in which the semiconductor substrate is supported on a semiconductor substrate support, comprising: flowing 300 to 600 sccm of a He—$H_2$ gas mixture containing 4% $H_2$ and 100 to 300 sccm $N_2$ into the bevel etcher and energizing the gas mixture into a plasma; and
    bevel edge etching the semiconductor substrate with the plasma in the bevel etcher while evacuating the bevel etcher to a pressure of 3 to 100 Torr.

10. A method of bevel edge etching a semiconductor substrate with a plasma in a bevel etcher in which the semiconductor substrate is supported on a semiconductor substrate support, comprising: flowing a process gas comprising 5 to 20 sccm $NF_3$ and 100 to 300 sccm $CO_2$ into the bevel etcher at a periphery of the semiconductor substrate and energizing the process gas into a plasma; and
    bevel edge etching the semiconductor substrate with the plasma in the bevel etcher while evacuating the bevel etcher to a pressure of 3 to 100 Torr.

11. The method of claim 1, comprising bevel etching a 300 mm wafer having 65 nm technology node or below, a 2 mm or below edge exclusion at the outer periphery thereof and exposed metal lines on an upper surface of the wafer.

12. The method of claim 1, wherein the process gas comprises $NF_3$, $CO_2$ and optionally $N_2$.

13. The method of claim 1, wherein during the bevel edge etching $N_2$ is flowed into the bevel etcher at a center of the semiconductor substrate.

14. The method of claim 1, wherein the process gas comprises a $CF_4$ and $CO_2$ gas mixture flowed into the bevel etcher at a periphery of the semiconductor substrate.

* * * * *